United States Patent
Wang et al.

(10) Patent No.: US 12,484,357 B2
(45) Date of Patent: Nov. 25, 2025

(54) ARRAY SUBSTRATE, METHOD FOR FORMING THE SAME, DISPLAY PANEL AND DISPLAY DEVICE

(71) Applicants: Beijing BOE Optoelectronics Technology Co., Ltd., Beijing (CN); BOE Technology Group Co., Ltd., Beijing (CN)

(72) Inventors: Zhiyong Wang, Beijing (CN); Yong Song, Beijing (CN); Yanyan Yin, Beijing (CN); Jing Xue, Beijing (CN); Shilong Liang, Beijing (CN); Hongyan Xing, Beijing (CN)

(73) Assignees: Beijing BOE Optoelectronics Technology Co., Ltd., Beijing (CN); Boe Technology Group Co., Ltd., Beijing (CN)

( * ) Notice: Subject to any disclaimer, the term of this patent is extended or adjusted under 35 U.S.C. 154(b) by 632 days.

(21) Appl. No.: 17/780,263

(22) PCT Filed: Jun. 23, 2021

(86) PCT No.: PCT/CN2021/101770
§ 371 (c)(1),
(2) Date: May 26, 2022

(87) PCT Pub. No.: WO2021/259311
PCT Pub. Date: Dec. 30, 2021

(65) Prior Publication Data
US 2022/0416138 A1 Dec. 29, 2022

(30) Foreign Application Priority Data

Jun. 23, 2020 (CN) .......................... 202010581627.6

(51) Int. Cl.
*H01L 33/62* (2010.01)
*G09F 9/33* (2006.01)
(Continued)

(52) U.S. Cl.
CPC ............. *H10H 20/857* (2025.01); *G09F 9/33* (2013.01); *G09G 3/2003* (2013.01); *G09G 3/32* (2013.01);
(Continued)

(58) Field of Classification Search
CPC . H01L 27/156; H01L 25/0753; H01L 25/167; H01L 33/62; H01L 33/382;
(Continued)

(56) References Cited

U.S. PATENT DOCUMENTS

| 8,441,420 B2 | 5/2013 | Kim et al. |
| 2014/0131677 A1 | 5/2014 | Oh et al. |

(Continued)

FOREIGN PATENT DOCUMENTS

| CN | 202796009 U | 3/2013 |
| CN | 103021349 A | 4/2013 |

(Continued)

OTHER PUBLICATIONS

CN 202010581627.6 first office action.
PCT/CN2021/101770 international search report and written opinion.

*Primary Examiner* — Victoria K. Hall
(74) *Attorney, Agent, or Firm* — IPro, PLLC

(57) ABSTRACT

An array substrate and a method for forming the array substrate, a display panel and a display device are provided in the present disclosure. The array substrate includes: a base substrate, a first electrode layer, a first insulating layer and a second electrode layer arranged sequentially on the base substrate, a light-emitting element group located on the
(Continued)

second electrode layer, where the light-emitting element group includes one or more light-emitting elements, each light-emitting element includes a first electrode, a light emitting layer and a second electrode, the first electrode is coupled to the first electrode layer, and the second electrode is coupled to the second electrode layer, so as to drive the light emitting layer to emit light.

17 Claims, 11 Drawing Sheets

(51) Int. Cl.
| | |
|---|---|
| *G09G 3/20* | (2006.01) |
| *G09G 3/32* | (2016.01) |
| *H01L 25/075* | (2006.01) |
| *H01L 25/16* | (2023.01) |
| *H01L 27/15* | (2006.01) |
| *H01L 33/00* | (2010.01) |
| *H01L 33/38* | (2010.01) |
| *H10H 20/01* | (2025.01) |
| *H10H 20/831* | (2025.01) |
| *H10H 20/857* | (2025.01) |
| *H10H 29/14* | (2025.01) |

(52) U.S. Cl.
CPC ........ *H01L 25/0753* (2013.01); *H01L 25/167* (2013.01); *H10H 20/01* (2025.01); *H10H 20/8312* (2025.01); *H10H 29/142* (2025.01); *G09G 2300/0842* (2013.01); *G09G 2320/0223* (2013.01); *G09G 2320/0693* (2013.01); *G09G 2360/145* (2013.01); *H10H 20/032* (2025.01); *H10H 20/0364* (2025.01)

(58) Field of Classification Search
CPC .... H01L 2933/0016; H01L 2933/0066; G09G 3/32; H10K 59/124; H10K 59/131; H10K 59/1315; H10K 59/179; H10K 59/1795; H10H 29/142; H10H 29/851; H10H 29/036; H10H 20/851; H10H 20/8312; H10H 20/032; H10H 20/036

See application file for complete search history.

(56) References Cited

U.S. PATENT DOCUMENTS

| | | | |
|---|---|---|---|
| 2015/0170563 | A1 | 6/2015 | Bang |
| 2017/0153759 | A1 | 6/2017 | Ding et al. |
| 2019/0326348 | A1* | 10/2019 | Im .................. H01L 27/156 |
| 2020/0043949 | A1 | 2/2020 | Lee et al. |
| 2020/0168661 | A1* | 5/2020 | Xue .................. H01L 33/62 |
| 2021/0036081 | A1 | 2/2021 | Song et al. |
| 2021/0335990 | A1 | 10/2021 | Chen et al. |
| 2021/0336189 | A1 | 10/2021 | Li et al. |
| 2022/0231109 | A1 | 7/2022 | Liu et al. |
| 2022/0335879 | A1 | 10/2022 | Chen |

FOREIGN PATENT DOCUMENTS

| | | |
|---|---|---|
| CN | 104835454 A | 8/2015 |
| CN | 107221291 A | 9/2017 |
| CN | 107742636 A | 2/2018 |
| CN | 107845739 A | 3/2018 |
| CN | 108231847 A | 6/2018 |
| CN | 109166886 A | 1/2019 |
| CN | 109524443 A | 3/2019 |
| CN | 109728000 A | 5/2019 |
| CN | 110264963 A | 9/2019 |
| CN | 110429116 A | 11/2019 |
| CN | 110867525 A | 3/2020 |
| CN | 210349841 U | 4/2020 |
| CN | 111211243 A | 5/2020 |
| CN | 111627350 A | 9/2020 |
| CN | 112736096 A | 4/2021 |

* cited by examiner

ARRAY SUBSTRATE, METHOD FOR FORMING THE SAME, DISPLAY PANEL AND DISPLAY DEVICE

CROSS REFERENCE TO RELATED APPLICATIONS

This application is the U.S. national phase of PCT Application No. PCT/CN2021/101770 filed on Jun. 23, 2021, which claims priority to the Chinese patent application No. 202010581627.6 filed in China on Jun. 23, 2020, which is incorporated herein by reference in its entirety.

TECHNICAL FIELD

The present disclosure relates to the field of display technology, in particular to an array substrate and a method for forming the array substrate, a display panel and a display device.

BACKGROUND

In a self-luminescence display, micro-light-emitting element groups arranged in an array form are controlled dynamically to be turned on or off through a chip, so as to realize the display function. Since there is an absolute black state, a contrast in the self-luminescence display may be infinity in theory. In addition, since there is no backlight assembly, a thicknesses of the self-luminescence display is reduced. The above-mentioned effects cannot be achieved in a conventional light-transmission display.

SUMMARY

In one aspect, an array substrate is provided, including: a base substrate, a first electrode layer, a first insulating layer and a second electrode layer arranged sequentially on the base substrate, a light-emitting element group located on the second electrode layer, where the light-emitting element group includes one or more light-emitting elements, each light-emitting element includes a first electrode, a light emitting layer and a second electrode, the first electrode is coupled to the first electrode layer, and the second electrode is coupled to the second electrode layer, so as to drive the light emitting layer to emit light.

In a possible embodiment of the present disclosure, the array substrate further includes a planarization layer located at a side of the light-emitting element group away from the base substrate; and a driving circuit layer arranged on the planarization layer. The driving circuit layer includes a first switch transistor configured to control the first electrode to be electrically connected to, or electrically disconnected from, the first electrode layer, a first electrode of the first switch transistor is coupled to an auxiliary layer via a first through hole, and a second electrode of the first switch transistor is coupled to the first electrode layer via a second through hole.

In a possible embodiment of the present disclosure, the driving circuit layer further includes a scanning signal line, a second switch transistor, a data signal line, a storage capacitor and a common electrode layer, a control electrode of the first switch transistor is coupled to a first electrode of the second switch transistor via a through hole, the first electrode of the second switch transistor is coupled to a first electrode plate of the storage capacitor, the data signal line is coupled to a second electrode of the second switch transistor, the scanning signal line is coupled to a control electrode of the second switch transistor, and the common electrode layer is used as a second electrode plate of the storage capacitor.

In a possible embodiment of the present disclosure, the array substrate further includes a second insulating layer located between the planarization layer and the driving circuit layer. The first through hole penetrates the second insulating layer and a part of the planarization layer, and the second through hole penetrates the second electrode layer.

In a possible embodiment of the present disclosure, the planarization layer is made of a resin material.

In a possible embodiment of the present disclosure, each of orthogonal projections of the first electrode layer and the second electrode layer onto the base substrate overlaps projections of all light-emitting elements onto the base substrate.

In a possible embodiment of the present disclosure, the array substrate further includes an auxiliary layer. The auxiliary layer is arranged at a same layer and made of a same material as the second electrode layer and spaced apart from the second electrode layer, the first electrode is arranged at a side of the auxiliary layer away from the base substrate.

In a possible embodiment of the present disclosure, orthogonal projections of the first electrode and the second electrode onto the base substrate are at two sides of an orthogonal projection of the light emitting layer onto the base substrate respectively.

In a possible embodiment of the present disclosure, in the case that the light-emitting element group includes a plurality of light-emitting elements, the plurality of light-emitting elements is arranged in parallel or in series.

In another aspect, a display panel is further provided, including the above-mentioned array substrate.

In yet another aspect, a display device is further provided, including the above-mentioned display panel.

In still yet another aspect, a method for forming a display substrate is further provided, including: forming a first electrode layer, a first insulating layer and a second electrode layer on a base substrate sequentially; and forming a light-emitting element group at a side of the second electrode layer away from the base substrate, where the light-emitting element group includes one or more light-emitting elements, each light-emitting element includes a first electrode, a light emitting layer and a second electrode, the first electrode is coupled to the first electrode layer, and the second electrode is coupled to the second electrode layer, so as to drive the light emitting layer to emit light.

In a possible embodiment of the present disclosure, the method further includes: forming a planarization layer at a side of the light-emitting element group away from the base substrate, and forming a driving circuit layer at a side of the planarization layer away from the base substrate, where the driving circuit layer includes a first switch transistor configured to control the first electrode to be electrically connected to, or electrically disconnected from, the first electrode layer, a first electrode of the first switch transistor is coupled to an auxiliary layer via a first through hole, and a second electrode of the first switch transistor is coupled to the first electrode layer via a second through hole.

In a possible embodiment of the present disclosure, the driving circuit layer further includes a scanning signal line, a second switch transistor and a storage capacitor, subsequent to forming the planarization layer at the side of the light-emitting element group away from the base substrate, the method further includes: forming the scanning signal line, a control electrode of the first switch transistor and a control electrode of the second switch transistor at the side of the planarization layer away from the base substrate; forming a second insulating layer; forming a semiconductor layer at a side of the second insulating layer away from the base substrate; forming a data signal line, the first electrode and the second electrode of the first switch transistor, a first electrode and a second electrode of the second switch transistor and a first electrode plate of the storage capacitor at a side of the semiconductor layer away from the base substrate, where the first electrode of the first switch transistor is coupled to the first electrode layer via a through hole, the second electrode of the first switch transistor is coupled to the first electrode of the light-emitting element, the control electrode of the first switch transistor is coupled to the first electrode of the second switch transistor via a through hole, the first electrode of the second switch transistor is coupled to the first electrode plate of the storage capacitor, the data signal line is coupled to the second electrode of the second switch transistor, and the scanning signal line is coupled to the control electrode of the second switch transistor; and forming a third insulating layer and a common electrode layer, where the common electrode layer forms a second electrode plate of the storage capacitor, an orthogonal projection of the common electrode layer onto the base substrate at least partially overlaps an orthogonal projection of the first electrode plate of the storage capacitor onto the base substrate.

In a possible embodiment of the present disclosure, the forming the second electrode layer includes: forming the second electrode layer and the auxiliary layer simultaneously by using a same mask through a same patterning process. The auxiliary layer is spaced apart from the second electrode layer, and the first electrode is arranged at a side of the auxiliary layer away from the base substrate.

In a possible embodiment of the present disclosure, the planarization layer is made of a resin material.

In another aspect, a brightness adjusting method for the above-mentioned array substrate is further provided, including: determining a first quantity of scanning operations of the array substrate within one frame in accordance with predetermined first color depth, where pixels in each row of the array substrate are scanned during each scanning process.

In a possible embodiment of the present disclosure, the method further includes: applying a scanning signal to the control electrode of each second switch transistor in the array substrate, to turn on each second switch transistor; applying different data voltages to the second electrode of each second switch transistor; determining brightness values of all light-emitting element groups in the array substrate corresponding to the different data voltages, and establishing a correspondence between the data voltages and the brightness values; where the quantity of different data voltages is determined in accordance with predetermined second color depth, and the first color depth and the second color depth constitute third color depth; and determining a correspondence between the data voltages and color depth in accordance with a predetermined correspondence between the brightness values and the color depth.

In a possible embodiment of the present disclosure, the determining the brightness values of all light-emitting element groups in the array substrate corresponding to different data voltages includes: determining the brightness values of the light-emitting element groups corresponding to different data voltages in accordance with a predetermined correspondence between the brightness values of the light-emitting element groups and currents of the light-emitting element groups and a predetermined correspondence between the currents of the light-emitting element groups and voltages of the light-emitting element groups.

In a possible embodiment of the present disclosure, the first color depth constitutes a high-order bit of the third color depth and the second color depth constitutes a low-order bit of the third color depth.

In a possible embodiment of the present disclosure, the method further includes: receiving image data to be displayed; determining color depth of the image data to be displayed; determining a second quantity of scanning operations of the array substrate within one frame in accordance with the color depth in the case that the color depth is less than or equal to the first color depth; determining a third quantity of scanning operations of the array substrate within one frame in accordance with the first color depth in the case that the color depth is greater than the first color depth; determining a first value of the different data voltages in accordance with a difference value between the color depth and the first color depth; selecting a low-order bit corresponding to the first value from the third color depth, and determining an output data voltage corresponding to the selected low-order bit; and displaying the image data to be displayed in accordance with the output data voltage and/or the first quantity of scanning operations within one frame.

In a possible embodiment of the present disclosure, the array substrate further includes an enable signal Input end, and when the pixels in each row of the array substrate are scanned, the method further includes: applying an enable signal to the enable signal Input end; applying an active scanning signal to the control electrode of each second switch transistor in each row at a first rising edge of the enable signal, to turn on each second switch transistor; applying an active data voltage to the second electrode of each second switch transistor in each row at a second rising edge of the enable signal; after a predetermined time period, applying an inactive scanning signal to the control electrode of each second switch transistor in each row at a first falling edge of the enable signal; and applying an inactive data voltage to the second electrode of each second switch transistor in each row at a second falling edge of the enable signal.

DETAILED DESCRIPTION

In order to make the objects, the technical solutions and the advantages of the present disclosure more apparent, the present disclosure will be described hereinafter in a clear and complete manner in conjunction with the drawings and embodiments. The following embodiments merely relate to a part of, rather than all of, the embodiments of the present disclosure, and based on these embodiments, a person skilled in the art may, without any creative effort, obtain the other embodiments, which also fall within the scope of the present disclosure.

Since the light-emitting elements in the self-luminescence display are essentially current-driven power members, a typical single active matrix switch cannot perform the driving function. If a passive driving scheme is used, at least one driving line needs to be provided for each light-emitting element (group), and proportioned driving chips are required, leading to great difficulty in wiring.

In addition, a large line loss, i.e., so-called IR Drop, occurs in the current driving scheme, so a normal operation of the light-emitting element (group) may be adversely affected, and the power consumption may be also increased. Taking a common glass-based self-luminescence product as an example, a proportion of the line loss to a total power consumption of the entire product may be 10%-25%.

Figure 1:
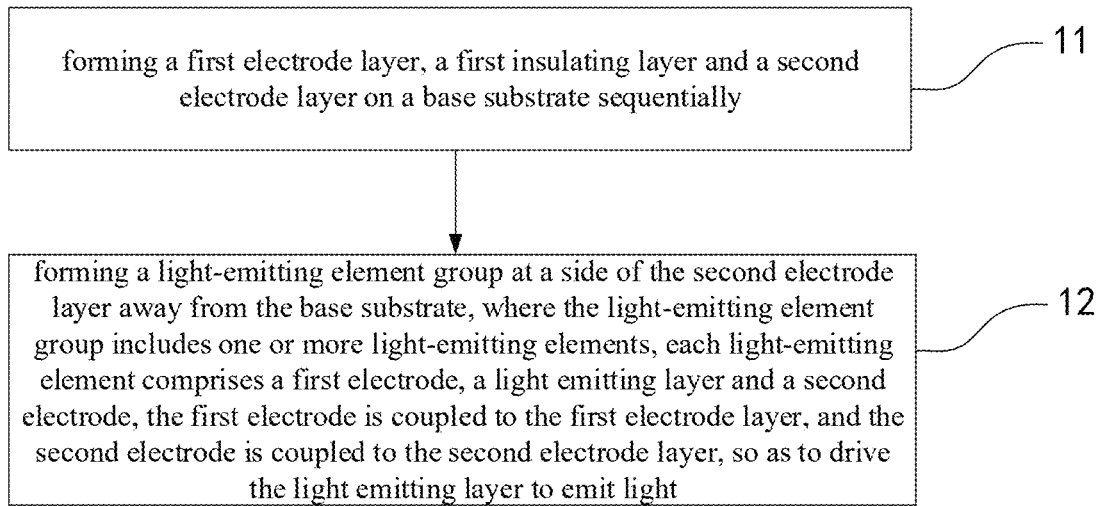
FIG. 1 is a flowchart of a method for forming the array substrate according to one embodiment of the present disclosure.

FIG. 1 is a flowchart of a method for forming the array substrate according to one embodiment of the present disclosure. As shown in FIG. 1, the method for forming the array substrate is provided, which may include the following steps.

Step 11: forming a first electrode layer, a first insulating layer and a second electrode layer on a base substrate sequentially.

In some embodiments of the present disclosure, the first electrode layer and the second electrode layer are each arranged in an entire layer manner.

Figure 2:
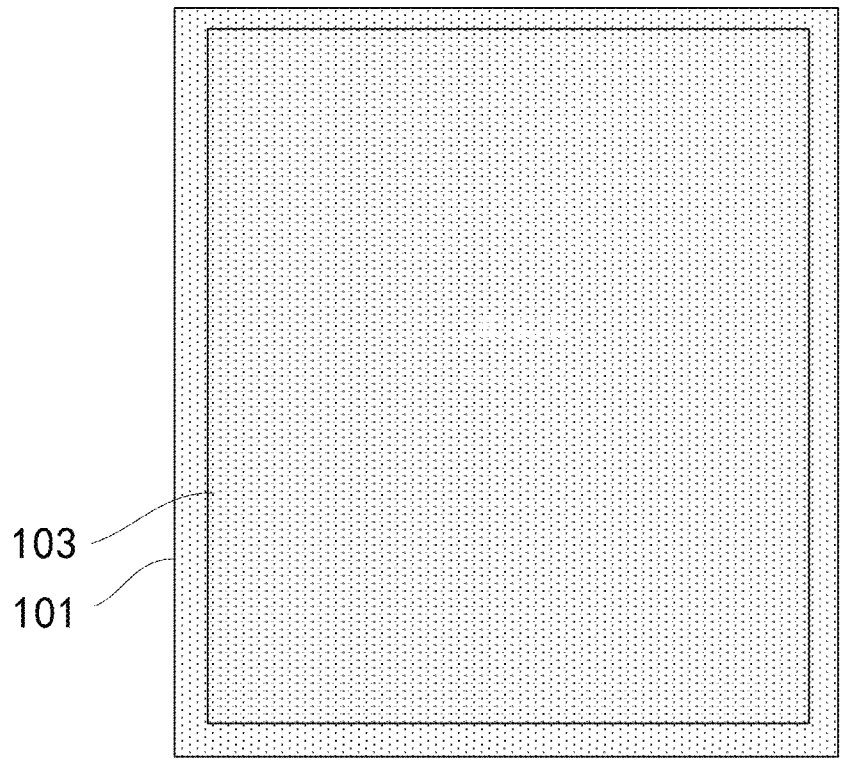
FIG. 2 is a schematic view showing forming a first electrode layer and a second electrode layer according to one embodiment of the present disclosure.

FIG. 2 is a schematic view showing forming a first electrode layer and a second electrode layer according to one embodiment of the present disclosure. As shown in FIG. 2, in step 11, a first electrode layer 101 may be arranged on the base substrate in an entire layer manner, and then a display region, a flexible circuit board/driving chip connection pin and a subsequent alignment mark of a subsequent process are formed through a wet etching process. Next, an insulating protection layer (i.e., a first insulating layer) is arranged on the first electrode layer 101, and may be made of a resin or a nitrogen silicon compound. In the case of a photosensitive resin, exposure and development needs to be performed subsequently to form a connection hole. In the case of the nitrogen silicon compound, a connection hole may be formed at a same position in various insulating protection layers through one subsequent dry etching process. Next, the second electrode layer 103 may be arranged subsequently in an entire layer manner, and a display region, a flexible circuit board/driving chip connection pin and a connection hole for an upper layer circuit are formed through a wet etching process.

In the embodiment of the present disclosure, the first electrode layer 101 may be an anode and the second electrode layer 103 may be a cathode. The cathode and the anode are each arranged in an entire layer manner and at different layers, so as to reduce the IR drop of a product signal to the greatest extent, reduce the difficulty in wiring, and avoid the increase in the power consumption caused by the line loss.

Step 12: forming a light-emitting element group at a side of the second electrode layer away from the base substrate, where the light-emitting element group includes one or more light-emitting elements, each light-emitting element comprises a first electrode, a light emitting layer and a second electrode, the first electrode is coupled to the first electrode layer, and the second electrode is coupled to the second electrode layer, so as to drive the light emitting layer to emit light.

Next, a planarization layer is formed at a side of the light-emitting element group away from the base substrate, and a second electrode of the light-emitting element group is coupled to the second electrode layer.

Figure 3:
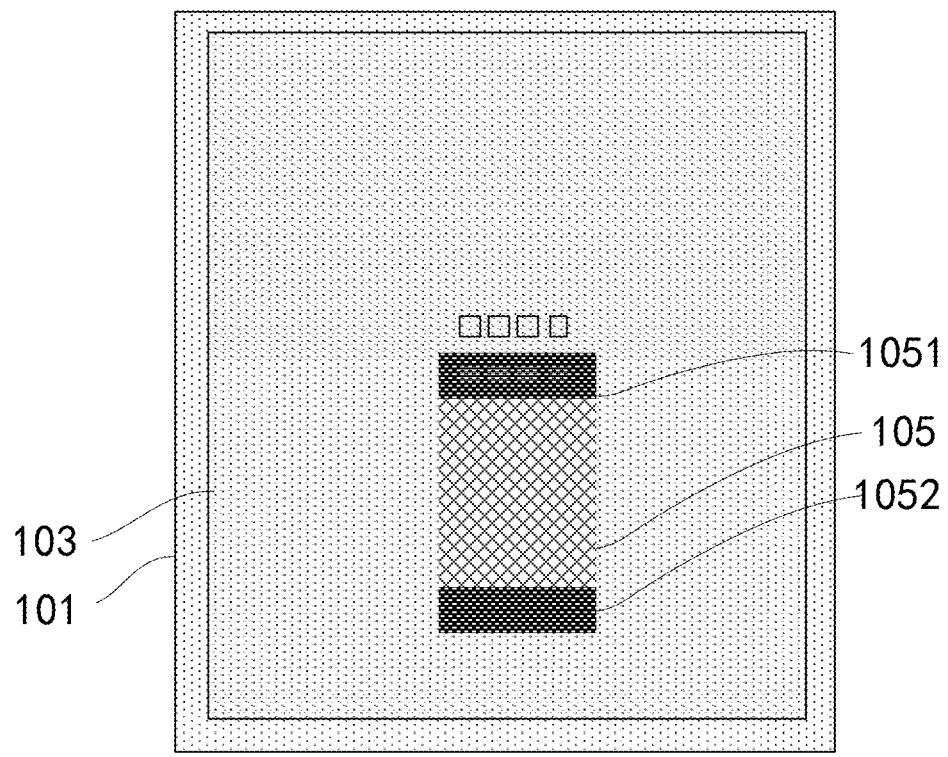
FIG. 3 is a schematic view showing forming or placing a light-emitting element group on a second electrode layer according to one embodiment of the present disclosure.

FIG. 3 is a schematic view showing forming at least one light-emitting element group on the second electrode layer according to one embodiment of the present disclosure. As shown in FIG. 3, in the embodiment of the present disclosure, the light-emitting element group 105 may be directly formed on the second electrode layer 103 through evaporation, printing, etc. Alternatively, at least one light-emitting element group 105 formed on such a substrate as a silicon-based substrate may be placed on the second electrode layer 103 through (massive) transfer, etc. The light-emitting element group 105 includes a first electrode 1051 and a second electrode 1052, the first electrode 1051 may be an anode of the light-emitting element group 105, and the second electrode 1052 may be a cathode of the light-emitting element group 105. The second electrode 1052 of the light-emitting element group 105 is directly coupled to the second electrode layer 103.

In some embodiments of the present disclosure, the method further includes: forming a planarization layer at a side of the light-emitting element group away from the base substrate, and forming a driving circuit layer at a side of the planarization layer away from the base substrate, where the driving circuit layer includes a first switch transistor configured to control the first electrode to be electrically connected to, or electrically disconnected from, the first electrode layer, a first electrode of the first switch transistor is coupled to an auxiliary layer via a first through hole, and a second electrode of the first switch transistor is coupled to the first electrode layer via a second through hole.

Next, the planarization layer is formed at the side of the light-emitting element group 105 away from the base substrate, and configured to cover and protect the light-emitting element group 105 and forms a relatively planarization surface, so as to facilitate the subsequent process.

In the embodiment of the present disclosure, when the light-emitting element group 105 includes a plurality of light-emitting elements, the plurality of light-emitting elements may be arranged in parallel or in series. When the plurality of light-emitting elements is arranged in parallel or in series, a single control switch can be used to control the plurality of light-emitting elements to be turned on or off. The light-emitting element may be a light emitting diode, and the light emitting diode may be a LED, a mini-LED or a Micro-LED.

In general, a proportion of an area of the light-emitting element groups to an area of the entire display region is only 10%-40%, namely, light sources are relatively few and scattered, so, as compared with the light-transmission display in related art, the continuity of the brightness is not good, and a protection adhesive is required to soften the light and protect the light-emitting element. In the embodiment of the present disclosure, the planarization layer may be made of a resin material. When an insulating resin having a light-scattering function, rather than the protection adhesive in the related art, is used, the light can be softened, the process accuracy can be improved, and the process steps can be reduced. According to requirement on softening the light of the light-emitting element group 105, components of the resin material may be adjusted. For example, various components having different refractive indices are added, so as to achieve the light-scattering effect. Various color filter materials may also be added, to adjust the overall chromaticity of the product. A certain amount of fluorescent agent may even be added, so that a same light-emitting element (group) emits light in different colors.

In some embodiments of the present disclosure, the driving circuit layer further includes a scanning signal line, a second switch transistor and a storage capacitor, subsequent to forming the planarization layer at the side of the light-emitting element group away from the base substrate, the method further includes: forming the scanning signal line, a control electrode of the first switch transistor and a control electrode of the second switch transistor at the side of the planarization layer away from the base substrate; forming a second insulating layer; forming a semiconductor layer at a side of the second insulating layer away from the base substrate; forming a data signal line, the first electrode and the second electrode of the first switch transistor, a first electrode and a second electrode of the second switch transistor and a first electrode plate of the storage capacitor at a side of the semiconductor layer away from the base substrate, where the first electrode of the first switch transistor is coupled to the first electrode layer via a through hole, the second electrode of the first switch transistor is coupled to the first electrode of the light-emitting element, the control electrode of the first switch transistor is coupled to the first electrode of the second switch transistor via a through hole, the first electrode of the second switch transistor is coupled to the first electrode plate of the storage capacitor, the data signal line is coupled to the second electrode of the second switch transistor, and the scanning signal line is coupled to the control electrode of the second switch transistor; and forming a third insulating layer and a common electrode layer, where the common electrode layer forms a second electrode plate of the storage capacitor, an orthogonal projection of the common electrode layer onto the base substrate at least partially overlaps an orthogonal projection of the first electrode plate of the storage capacitor onto the base substrate.

In some embodiments of the present disclosure, the driving circuit layer includes the scanning signal line, the first switch transistor, the second switch transistor, the data signal line, the storage capacitor and the common electrode layer. A source electrode of the first switch transistor is coupled to the first electrode layer via the through hole, a drain electrode of the first switch transistor is coupled to the first electrode of the light-emitting device group, a gate electrode of the first switch transistor is coupled to a source electrode of the second switch transistor via the through hole, a source electrode of the second switch transistor is coupled to the first electrode plate of the storage capacitor, the data signal line is coupled to a drain electrode of the second switch transistor, the scanning signal line is coupled to a gate electrode of the second switch transistor, and the common electrode layer is used as the second electrode plate of the storage capacitor.

Figure 4:
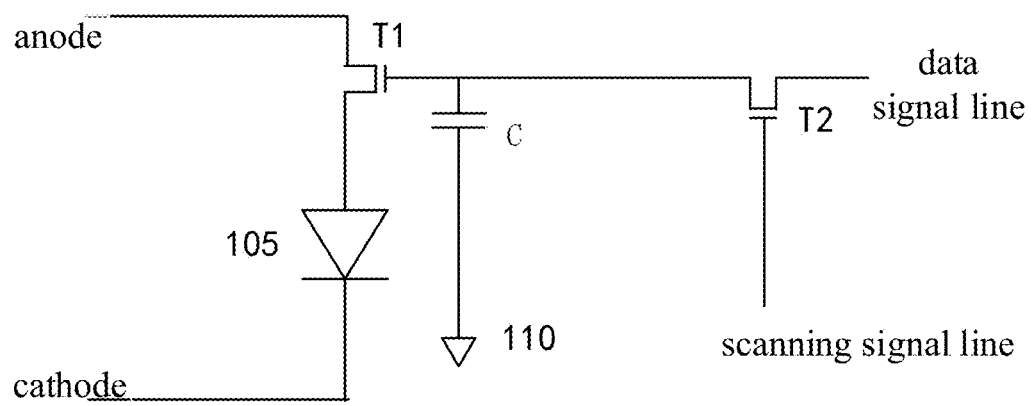
FIG. 4 is a schematic view showing a pixel circuit according to one embodiment of o the present disclosure.

FIG. 4 is a schematic view showing a pixel circuit according to one embodiment of the present disclosure. As shown in FIG. 4, in the embodiment of the present disclosure, the pixel circuit includes a group of anode and cathode corresponding to the first electrode layer 101 and the second electrode layer 103 respectively for providing a current, and further includes a first switch transistor T1, a second switch transistor T2 and a storage capacitor C. The source electrode of the first switch transistor T1 is coupled to the anode, the drain electrode of the first switch transistor T1 is coupled to the first electrode 1051 of the light-emitting element group 105, the second electrode 1052 of the light-emitting element group 105 is coupled to the cathode, the gate electrode of the first switch transistor T1 is coupled to the first electrode plate of the storage capacitor C, the second electrode plate of the storage capacitor C is coupled to the common electrode 110, the source electrode of the second switch transistor T2 is coupled to the gate electrode of the first switch transistor T1 and the first electrode plate of the storage capacitor C, the drain electrode of the second switch transistor T2 is coupled to the data signal line, and the gate electrode of the second switch transistor T2 is coupled to the scanning signal line.

The first switch transistor T1 is configured to control the light-emitting element group 105 to be turned on or off, and the storage capacitor C is configured to maintain a voltage of the gate electrode of the first switch transistor T1, so as to maintain the light-emitting element group 105 to be turned on or off. The second switch transistor T2 is configured to control the first switch transistor T1 to be turned on or off. Specifically, the gate electrode of the second switch transistor T2 receives a scanning signal from the scanning signal line, and the drain electrode of the second switch T2 receives a data signal from the data signal line, so as to enable the first switch transistor T1 to be turned on or off under the control of the scanning signal and the data signal.

In the embodiment of the present disclosure, the forming the driving circuit layer may specifically include the following steps.

The scanning signal line, the first switch transistor and the gate electrode of the second switch transistor are formed on the planarization layer, the scanning signal line is coupled to the gate electrode of the second switch transistor.

Figure 5:
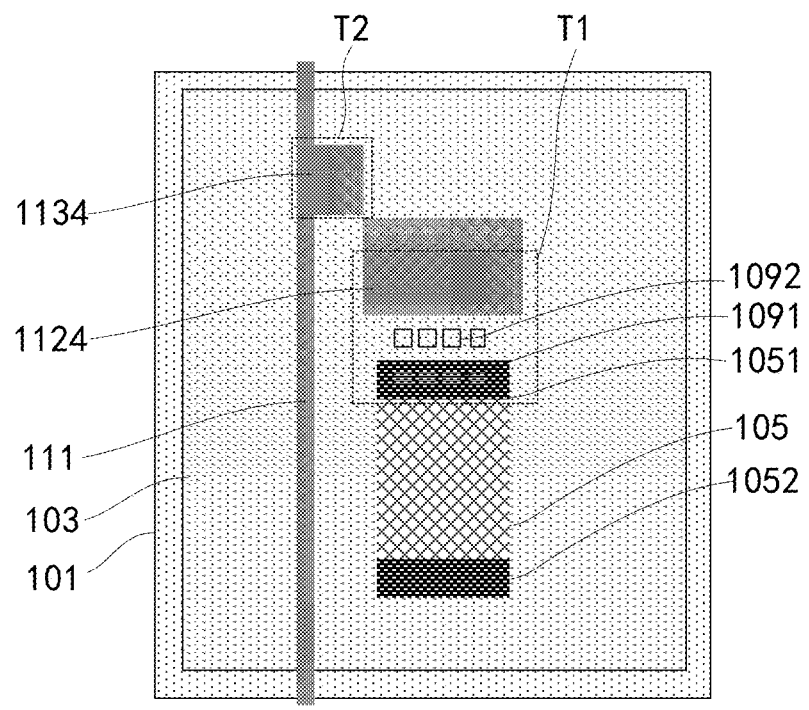
FIG. 5 is a schematic view showing forming a driving circuit layer according to one embodiment of the present disclosure.

FIG. 5 is a schematic view showing forming the driving circuit layer according to one embodiment of the present disclosure. As shown in FIG. 5, a metal layer is arranged on the planarization layer covering the light-emitting element group 105, and the scanning signal line 111, the gate electrode 1124 of the first switch transistor T1 and the gate electrode 1134 of the second switch transistor T2 are formed through a wet etching process.

Further, a protection layer (i.e., a second insulating layer) may also be arranged on the scanning signal line 111, and may be made of a nitrogen silicon compound.

Next, an active layer is formed at a side of the gate electrode away from the base substrate.

Figure 6:
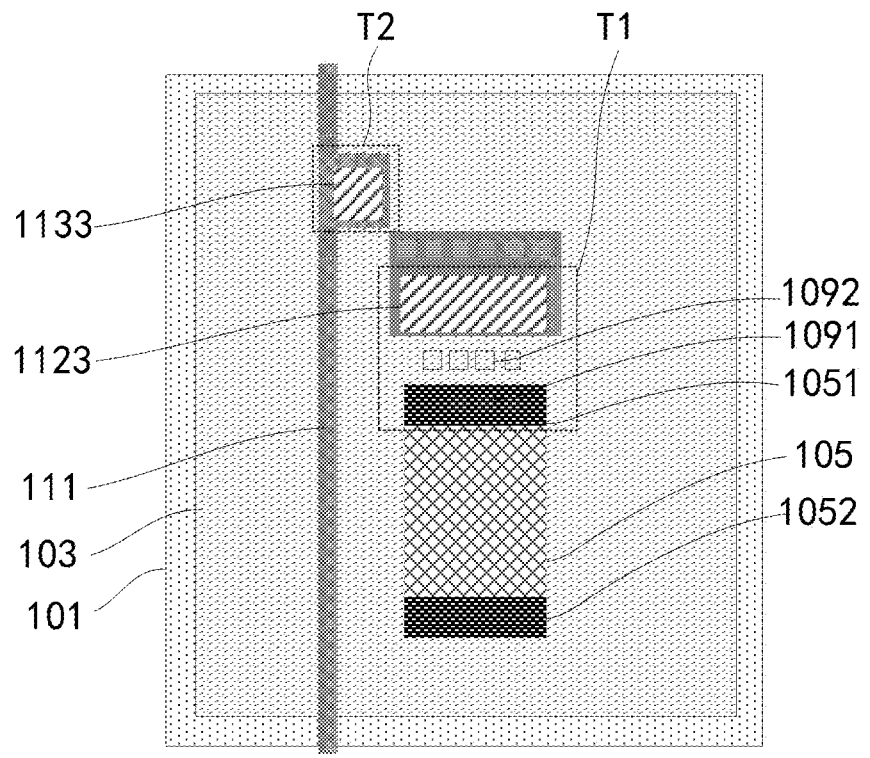
FIG. 6 is another schematic view showing forming the driving circuit layer according to one embodiment of the present disclosure.

FIG. 6 is another schematic view showing forming the driving circuit layer according to one embodiment of the present disclosure. As shown in FIG. 6, an active layer 1123 of the first switch transistor T1 and an active layer 1133 of the second switch transistor T2 are formed subsequently at the side of the gate electrode 1124 of the first switch transistor T1 away from the base substrate.

In the embodiment of the present disclosure, the current-driven self-luminescence element requires a large turn-on current, for example, it is presumed that the light-emitting element group 105 includes nine LEDs arranged in series, an estimated turn-on current is about 20 mA, and a width-to-length ratio is required to be about 1000 when the active layer of the first switch transistor T1 is made of polysilicon. Since the proportion of the area of the light-emitting element groups 105 to the area of the display region is not large, there is enough space for the light-emitting element groups in the case of the above-mentioned width-to-length ratio of the active layer. For the second switch transistor T2, a width-to-length ratio (usually less than 10) in the related art is able to meet the requirements. Of course, the above is for illustrative purpose only, the quantity of LEDs in the light-emitting element group 105 may be increased or decreased, and correspondingly, the width-to-length ratio of each active layer will be changed too.

Next, the data signal line, the source electrode and the drain electrode of the first switch transistor, the source electrode and the drain electrode of the second switch transistor, and the first electrode plate of the storage capacitor are formed. The source electrode of the first switch transistor is coupled to the first electrode layer via the through hole, the drain electrode of the first switch transistor is coupled to the first electrode of the light-emitting element group via the through hole, the gate electrode of the first switch transistor is coupled to the source electrode of the second switch transistor via the through hole, the drain electrode of the second switch transistor is coupled to the first electrode plate of the storage capacitor at a same layer, and the data signal line is coupled to the drain electrode of the second switch transistor at a same layer.

Figure 7:
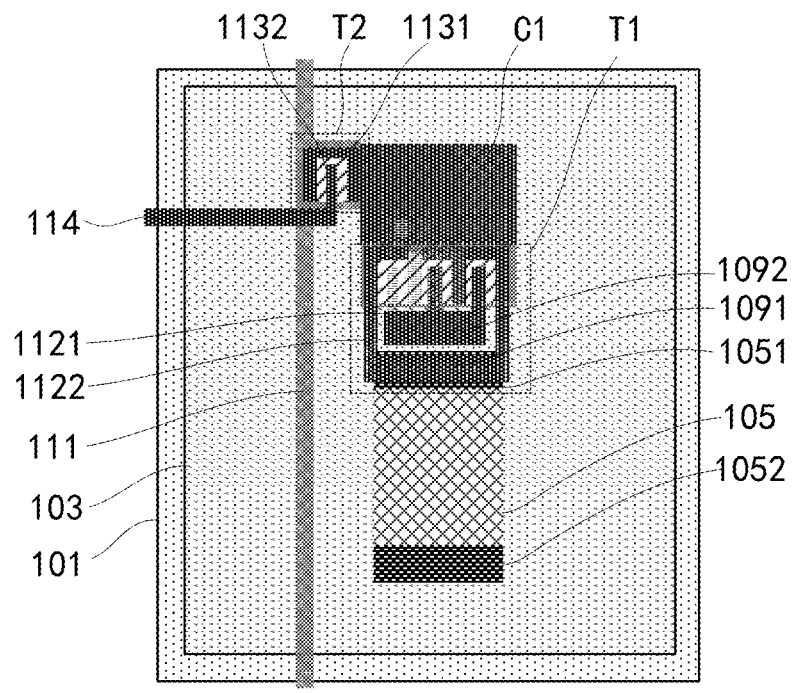
FIG. 7 is yet another schematic view showing forming the driving circuit layer according to one embodiment of the present disclosure.

FIG. 7 is yet another schematic view showing forming the driving circuit layer according to one embodiment of the present disclosure. As shown in FIG. 7, a metal layer is further arranged, and the data signal line 114, the source electrode 1121 and the drain electrode 1122 of the first switch transistor T1, the source electrode 1131 and the drain electrode 1132 of the second switch transistor T2, and the first electrode plate C1 of the storage capacitor C are formed through a wet etching process. The data signal line 114 is coupled to the drain electrode 1132 of the second switch transistor T2, the source electrode 1131 of the second switch transistor T2 is directly coupled to the first electrode plate C1 of the storage capacitor C, the source electrode 1121 of the first switch transistor T1 is coupled to the first electrode layer 101 via the second through hole 1092, the drain electrode 1122 of the first switch transistor T1 is coupled to the first electrode 1051 of the light-emitting element group 105 via the first through hole 1091, and the gate electrode 1124 of the first switch transistor T1 is coupled to the first electrode plate C1 of the storage capacitor C via the through hole.

Finally, a third insulating layer and a common electrode layer are formed sequentially. The common electrode layer forms the second electrode plate of the storage capacitor, an orthogonal projection of the common electrode layer onto the base substrate at least partially overlaps an orthogonal projection of the first electrode plate of the storage capacitor onto the base substrate.

Figure 8:
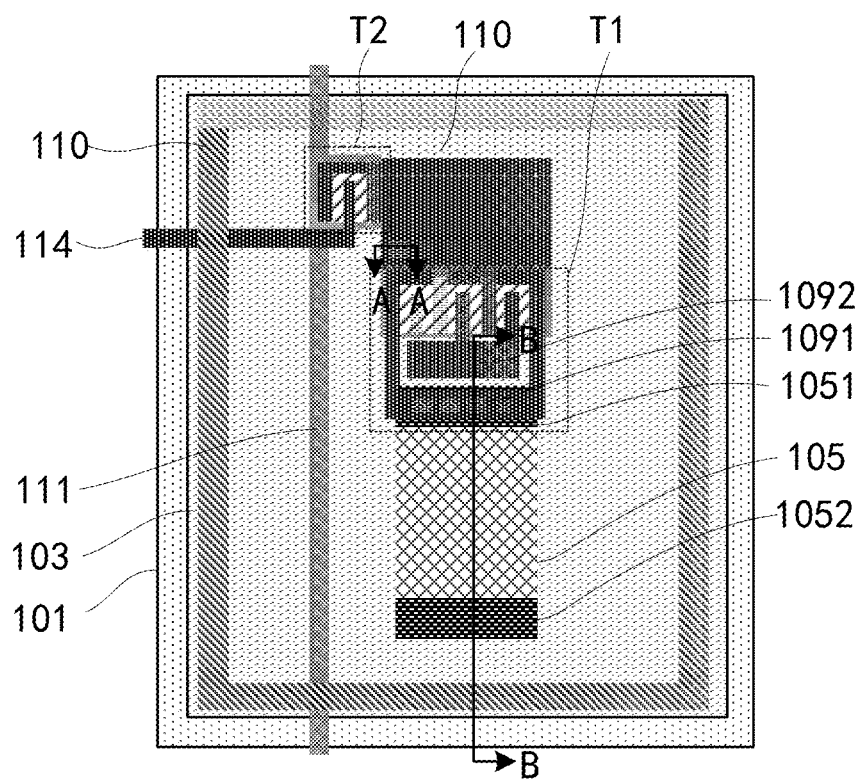
FIG. 8 is a schematic view showing an array substrate according to one embodiment of the present disclosure.

FIG. 8 is a schematic view showing an array substrate according to one embodiment of the present disclosure. As shown in FIG. 8, the third insulating layer is subsequently formed for covering and protecting the data signal line 114 and the like, and the third insulating layer may be made of a resin material or a nitrogen silicon compound. Next, a common electrode layer 110 is arranged, a part of the common electrode layer 110 directly above the first electrode plate C1 of the storage capacitor C is formed as the second electrode plate C2 of the storage capacitor C. A capacitance of the storage capacitor C is mainly determined by a scanning period, an off-state current of the second switch transistor T2, and a current-voltage characteristic of the first switch transistor T1. In other words, a size of the electrode plate of the storage capacitor C is adjusted in accordance with the above-mentioned factors, so as to obtain an appropriate capacitance.

Figure 9:
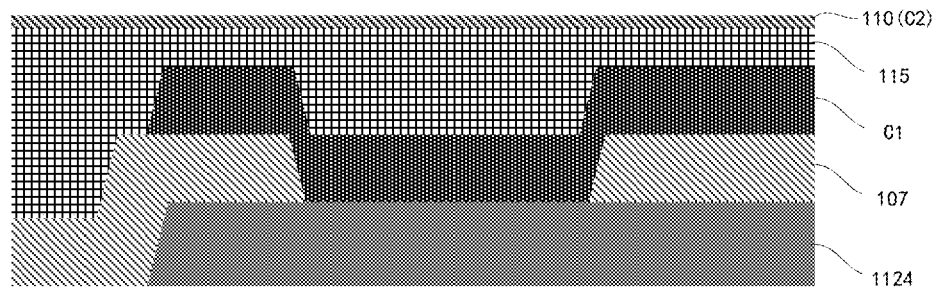
FIG. 9 is a sectional view of the array substrate in FIG. 8 along line A-A.
Figure 10:
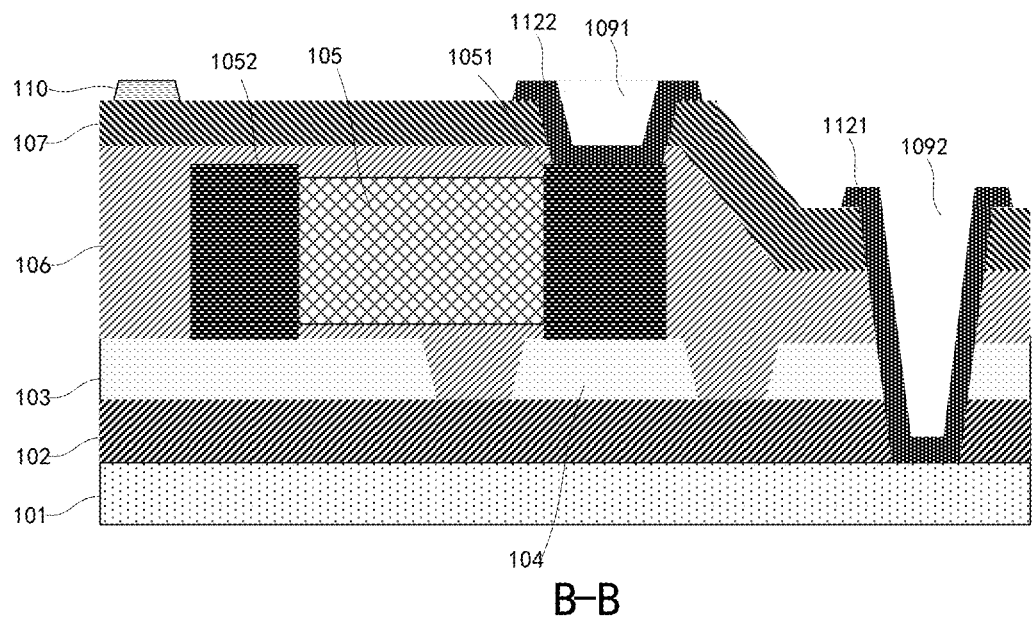
FIG. 10 is a sectional view of the array substrate in FIG. 8 along line B-B.

In order to illustrate the arrangement of the layers laminated one on another in the embodiments of the present disclosure in a clearer manner, reference is made to FIGS. 9 and 10, FIG. 9 is a sectional view of the array substrate in FIG. 8 along line A-A, and FIG. 10 is a sectional view of the array substrate in FIG. 8 along line B-B.

As shown in FIG. 9, the gate electrode 1124 of the first switch transistor T1 is coupled to the source electrode 1131 (also being the first electrode plate C1 of the storage capacitor C) of the second switch transistor T2 via the through hole provided in the second insulating layer 107. The source electrode 1131 (also being the first electrode plate C1 of the storage capacitor C) of the second switch transistor T2 and the common electrode layer 110 above the third insulating layer 115 together form the storage capacitor C. In other words, the common electrode layer 110 above the first electrode plate C1 of the storage capacitor C is also the second electrode plate C2 of the storage capacitor C.

As shown in FIG. 10, the array substrate includes the first electrode layer 101 (i.e., the anode) located on the base substrate, the first insulating layer 102 located on the first electrode layer 101, the second electrode layer 103 (i.e., the cathode) located on the first insulating layer 102, the light-emitting element group 105 located on the second electrode layer 103, where the second electrode 1052 of the light-emitting element group 105 is directly coupled to the second electrode layer 103, the planarization layer 106 (made of the resin material) covering the light-emitting element group 105, the second insulating layer 107, and the common electrode layer 110 located on the second insulating layer 107. The drain electrode 1122 of the first switch transistor T1 is coupled to the first electrode 1051 of the light-emitting element group 105 via the first through hole 1091, and the source electrode 1021 of the first switch transistor T1 is coupled to the first electrode layer 101 through the second through hole 1092.

In some embodiments of the present disclosure, the forming the second electrode layer includes: forming the second electrode layer and the auxiliary layer simultaneously by using a same mask through a same patterning process. The auxiliary layer is spaced apart from the second electrode layer, and the first electrode is arranged at a side of the auxiliary layer away from the base substrate.

In the embodiment of the present disclosure, the auxiliary layer is formed at the same time as the second electrode layer, and the first electrode of the light-emitting element group is arranged on the auxiliary layer.

As shown in FIG. 10, when the second electrode layer 103 is arranged in the entire layer manner, the auxiliary layer 104 is formed through wet etching. In other words, the auxiliary layer 104 is arranged at a same layer and made of a same material as the second electrode layer 103, and is spaced apart from the second electrode layer 103. The auxiliary layer 104 may be used as a supporting spacer for the first electrode 1051 of the light-emitting element group 105, so it is able to maintain flat when transferring and securing the light-emitting element group 105, thereby to improve the flatness of the array substrate.

In some embodiments of the present disclosure, the light-emitting element may be a self-luminescence element, so a transparent electrode is not required, and a metal material having a better conductivity may be used, so as to obtain a lower resistivity. It should be appreciated that if the metal material is easily oxidized and deteriorated in the environment, it is also necessary to apply a protection layer, which may be made of an epoxy resin, to prevent oxygen and moisture in the environment from entering the array substrate before the array substrate is finally formed.

After the array substrate has been formed, it needs to be coupled to the driving chip. The flexible circuit board may be coupled to a reserved connection position of the array substrate, or the driving chip may be directly placed at a reserved position of the array substrate, so as to save the cost of circuit board and relevant processes. In addition, since the design of a scanning driving chip is relatively simple and such factor as power is not required to be considered (a voltage-driven manner is used in the present disclosure), a circuit may be directly formed on the above-mentioned array substrate to realize the scanning driving chip function, so as to narrow a frame and reduce the cost.

A brightness adjusting method for the above-mentioned array substrate is further provided in the embodiments of the present disclosure, the method including: determining a first quantity of scanning operations of the array substrate within one frame in accordance with predetermined first color depth, where pixels in each row of the array substrate are scanned during each scanning process.

In some embodiments, the predetermined first color depth may be determined in accordance with the practical need. For example, the first color depth is 6 bits, and it may be determined that the quantity of scanning operations of the array substrate within one frame is 64. The pixels in each row of the array substrate are scanned during each scanning process.

In some embodiments of the present disclosure, more color depth may be further achieved through adjusting an input data voltage, the method further includes: applying a scanning signal to the control electrode of each second switch transistor in the array substrate, to turn on each second switch transistor; applying different data voltages to the second electrode of each second switch transistor; determining brightness values of all light-emitting element groups in the array substrate corresponding to the different data voltages, and establishing a correspondence between the data voltages and the brightness values; where the quantity of different data voltages is determined in accordance with predetermined second color depth, and the first color depth and the second color depth constitute third color depth; and determining a correspondence between the data voltages and color depth in accordance with a predetermined correspondence between the brightness values and the color depth.

Specifically, when the different data voltages are applied, all the light-emitting elements (groups) are maintained to be turned on within one frame, the brightness values (each of which may be an average value of brightness values of the light-emitting elements) of the array substrate are measured by using an optical instrument, and a correspondence between the data voltages and the brightness values is formed. In some embodiments of the present disclosure, the different data voltages may be determined with a voltage resolution (interval) of 5 mV. For example, multiple data voltages may be sequentially selected from 5 mV, 10 mV, 15 mV, and etc. In some embodiments of the present disclosure, the data voltages corresponding to 16 brightness levels may be selected, so as to further achieve 4 bits brightness depth (i.e., the color depth). At this time, it is able to achieve 10 bits brightness depth in the array substrate in combination with the above-mentioned quantity of scanning operations of the array substrate within one frame.

Through the following adjusting and correction steps, it is able to achieve a multi-color depth display of the array substrate.

a) Through simple operations of turning on and off, it is tested that it is able to separately control each light-emitting element (group) to be turned on or off b) Next, a plurality of scanning operations are performed within one frame, and a proportion of a time period where the light-emitting element (group) is turned on to a time period where the light-emitting element (group) is turned off within one frame is controlled through controlling a value of each scan data signal voltage. It is presumed that 64 scanning operations are performed within one frame, 64 adjustable brightness levels, i.e., 6 bits brightness depth for each light-emitting element (group) may be achieved in theory, is achieved.

c) Different data voltages are applied, all the light-emitting elements (groups) are maintained to be turned on within one frame, the brightness values (each of which may be an average value of brightness values of the light-emitting elements) of the array substrate are measured by using an optical instrument, and a correspondence between the data voltages and the brightness values is formed.

In some embodiments of the present disclosure, the determining the brightness values of all light-emitting element groups in the array substrate corresponding to different data voltages includes: determining the brightness values of the light-emitting element groups corresponding to different data voltages in accordance with a predetermined correspondence between the brightness values of the light-emitting element groups and currents of the light-emitting element groups and a predetermined correspondence between the currents of the light-emitting element groups and voltages of the light-emitting element groups.

Figure 11:
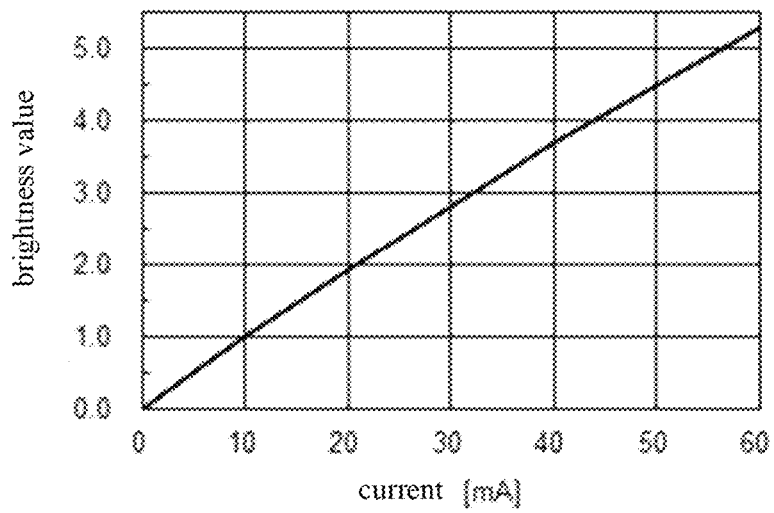
FIG. 11 is a schematic diagram of a current-brightness-value characteristic of the light-emitting element group according to one embodiment of the present disclosure.
Figure 12:
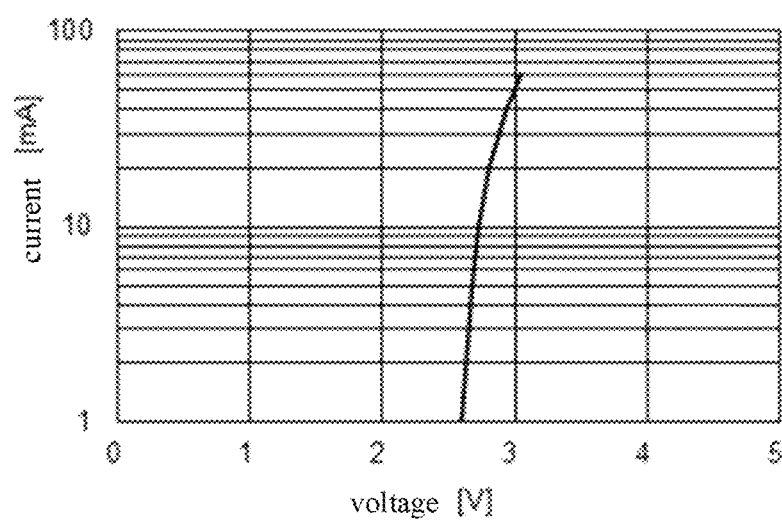
FIG. 12 is a schematic diagram of a current-voltage characteristic of the light-emitting element group according to one embodiment of the present disclosure.

In some embodiments of the present disclosure, the predetermined correspondence between the brightness values of the light-emitting element groups and the currents of the light-emitting element groups may be shown in FIG. 11, and the predetermined correspondence between the currents of the light-emitting element groups and the voltages of the light-emitting element groups may be shown in FIG. 12.

Figure 13:
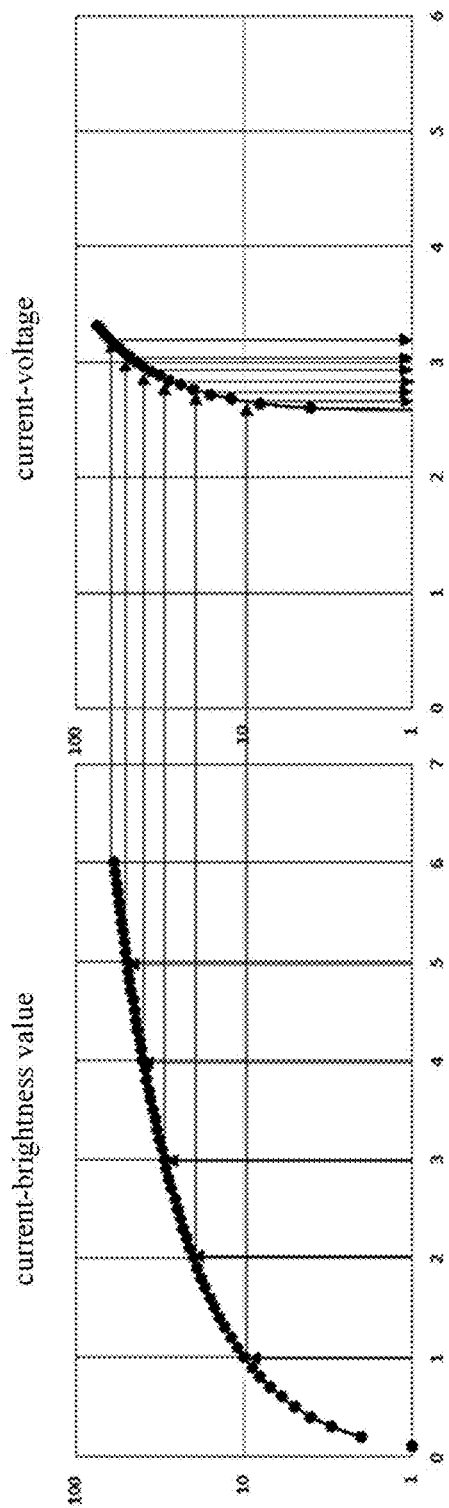
FIG. 13 is a schematic diagram of a correspondence between currents and brightness values and a correspondence between the currents and voltages according to one embodiment of the present disclosure.

Referring to FIGS. 11 to 13, FIG. 11 is a schematic diagram of a current-brightness-value characteristic of the light-emitting element group according to one embodiment of the present disclosure, FIG. 12 is a schematic diagram of a current-voltage characteristic of the light-emitting element group according to one embodiment of the present disclosure, and FIG. 13 is a schematic diagram of a correspondence between currents and brightness values and a correspondence between the currents and voltages according to one embodiment of the present disclosure. Next, different data signal voltages are applied, all the light-emitting elements (groups) are maintained to be turned on within one frame, the brightness values of the array substrate are measured by using an optical instrument, and a correspondence between the data signal voltages and the brightness values is formed. Voltages which are easily controlled (the voltage resolution of the data driving chip output is usually 5 mV or less) are selected, for example, voltages corresponding to 16 brightness levels may be selected, so as to achieve 4 bits brightness depth.

d) It is able to achieve 10 bits brightness depth through the above step b and step c, in combination with a mixture of three primary colors, it is able to achieve over 1 billion colors.

e) The quantity of scanning operations of the array substrate within one frame of step b) and the correspondence between the data voltages and color depth of step c) are written into the data driving chip, so as to convert the brightness value/color depth of an image to be displayed into the data signal voltage of the light-emitting element (group) and the quantity of times of turning on the light-emitting element (group) per frame.

In some embodiments of the present disclosure, the first color depth constitute a high-order bit of the third color depth and the second color depth constitute a low-order bit of the third color depth.

For example, the first color depth is 6 bits, and constitutes 6 high-order bits of the third color depth, and the second color depth is 4 bits, and constitutes 4 low-order bits of the third color depth.

In the present disclosure, it is able to achieve 10 bits color depth, and, in combination with a mixture of three primary colors, it is able to achieve over 1 billion colors, so it is able to determine a display of required color depth, e.g., such color depth as 5 bits, 8 bits, according to the image data to be displayed.

In some embodiments of the present disclosure, the image data to be displayed may be displayed in accordance with the following manners. The method further includes: receiving image data to be displayed; determining color depth of the image data to be displayed; determining a second quantity of scanning operations of the array substrate within one frame in accordance with the color depth in the case that the color depth is less than or equal to the first color depth; determining a third quantity of scanning operations of the array substrate within one frame in accordance with the first color depth in the case that the color depth is greater than the first color depth; determining a first value of the different data voltages in accordance with a difference value between the color depth and the first color depth; selecting a low-order bit corresponding to the first value from the third color depth, and determining an output data voltage corresponding to the selected low-order bit; and displaying the image data to be displayed in accordance with the output data voltage and/or the first quantity of scanning operations within one frame.

Specifically, when the color depth of the image data to be displayed is relatively small, the image data to be displayed may be displayed through the quantity of scanning operations within one frame. When the color depth of the image data to be displayed is relatively large and exceeds the first color depth, the image data to be displayed may be displayed in combination with the manner of adjusting the data voltage in the present disclosure.

In some embodiments of the present disclosure, for each light-emitting element (group), it is required that applying an active scanning signal is prior to applying an active data voltage, and applying an inactive scanning signal is prior to applying an inactive data voltage. In some embodiments of the present disclosure, it may be achieved through an enable signal.

Specifically, the array substrate further includes an enable signal Input end, and when the pixels in each row of the array substrate are scanned, the method further includes: applying an enable signal to the enable signal Input end; applying an active scanning signal to the control electrode of each second switch transistor in each row at a first rising edge of the enable signal, to turn on each second switch transistor; applying an active data voltage to the second electrode of each second switch transistor in each row at a second rising edge of the enable signal; after a predetermined time period, applying an inactive scanning signal to the control electrode of each second switch transistor in each row at a first falling edge of the enable signal; and applying an inactive data voltage to the second electrode of each second switch transistor in each row at a second falling edge of the enable signal.

Figure 14:
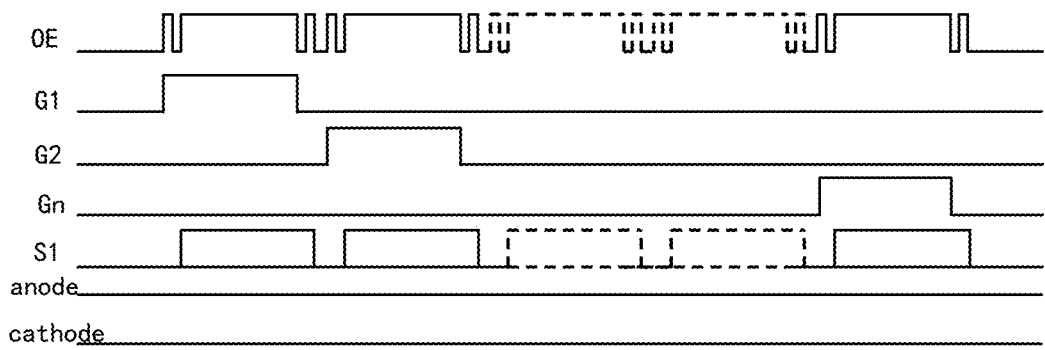
FIG. 14 is a timing sequence diagram of the pixel circuit according to one embodiment of the present disclosure.

FIG. 14 is a timing sequence diagram of the pixel circuit according to one embodiment of the present disclosure. As shown in FIG. 14, applying or stop applying each scanning signal is controlled through a rising edge signal and a falling edge signal of the enable signal (OE), and also controls a transmission period of the data signal (which is also called the data voltage) is further controlled. Applying each scanning signal is prior to applying the data signal and stop applying each scanning signal is also prior to stop applying the data signal. G1 denotes a first scanning signal, G2 denotes a second scanning signal, and Gn denotes an nth scanning signal. S1 denotes each data signal.

Figure 15:
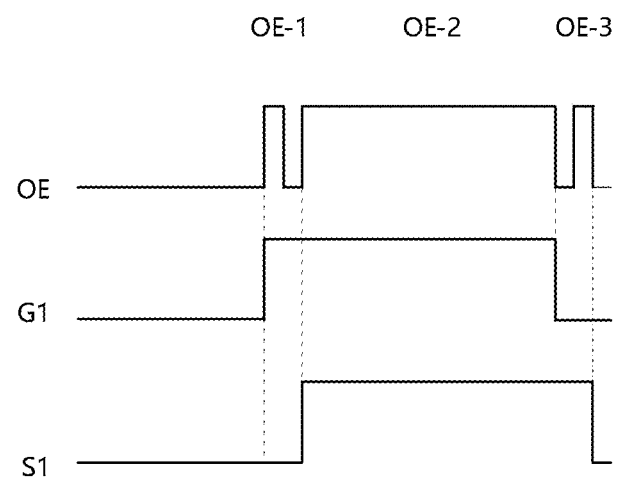
FIG. 15 is a schematic diagram of a correspondence among OE, G1 and S1 according to one embodiment of the present disclosure.

FIG. 15 is a schematic diagram of a correspondence among OE, G1 and S1 according to one embodiment of the present disclosure. As shown in FIG. 15, the enable signal (OE) may be divided into three separately adjustable stage OE-1, OE-2 and OE-3, which are used to control an applying time point of G1 (a rising edge of OE1), an applying time point of S1 (a rising edge of OE-2), a stop-applying time point of G1 (a falling edge of OE-2) and a stop-applying time point of S1 (a falling edge of OE-3) respectively. In other words, at the first rising edge of the enable signal (OE), the scanning signal from the scanning signal line is applied to the gate electrode of the second switch transistor, so as to turn on the second switch transistor. Next, at the second rising edge of the enable signal (OE), the data signal from the data signal line is applied to the drain electrode of the second switch transistor, and transmitted to the gate electrode of the first switch transistor via the second switch transistor, so as to turn on the first switch transistor, thereby to enable the light-emitting element group to emit light. At the falling edge of the enable signal (OE2), the scanning signal from the scanning signal line is stopped applying to the gate electrode of the second switch transistor, so as to turn off the second switch transistor. At the falling edge of the enable signal (OE3), the data signal from the data signal line is stopped.

Figure 16:
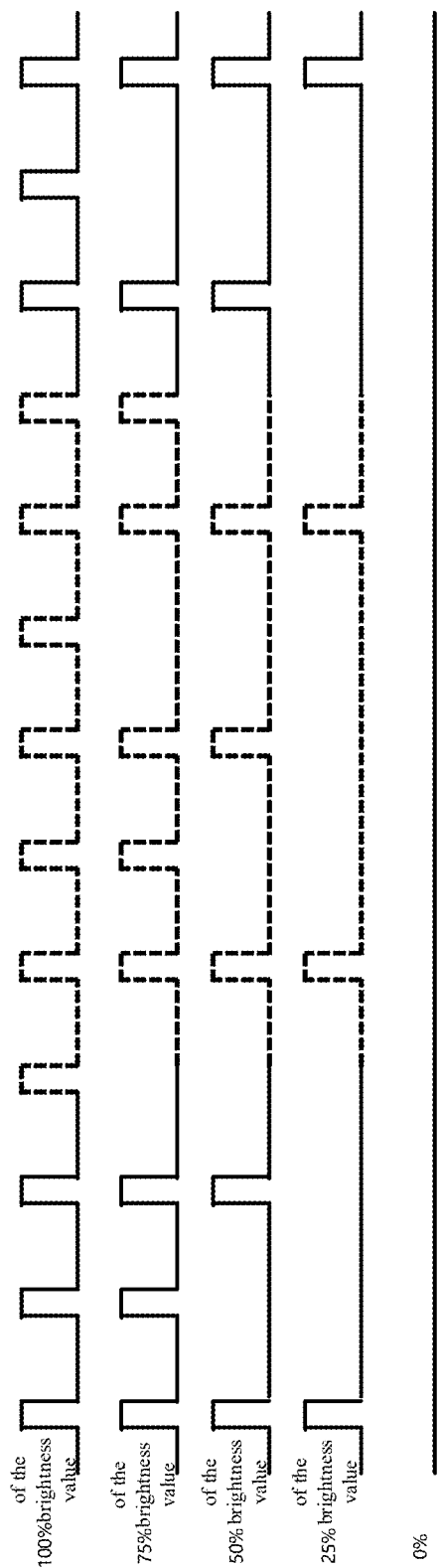
FIG. 16 is a sequence control diagram of the light-emitting element group in different brightness values according to one embodiment of the present disclosure.

FIG. 16 is a sequence control diagram of the light-emitting element group in different brightness values according to one embodiment of the present disclosure. As shown in FIG. 16, different brightness levels of the light-emitting element group are realized through adjusting the quantity of times of turning on the first switch transistor (in the case that the second switch transistor is turned on, when the data signal is a positive voltage, it means that the first switch transistor is turned on, and when the data signal is a negative voltage, it means that the first switch transistor is turned off) during each scanning within one frame.

Figure 17:
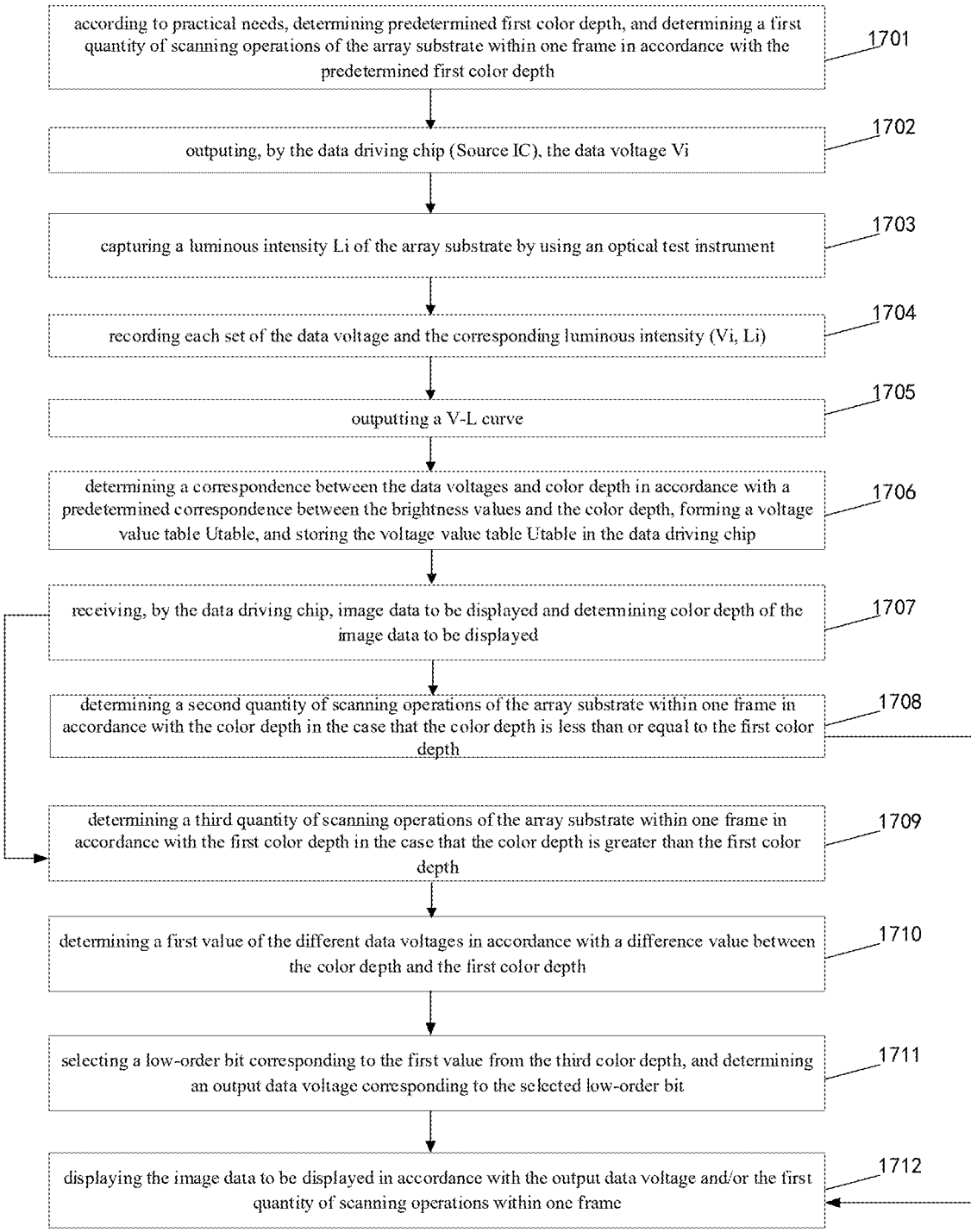
FIG. 17 is a flowchart of a procedure of brightness determining and display data outputting according to one embodiment of the present disclosure.

FIG. 17 is a flowchart of a procedure of brightness determining and display data outputting according to one embodiment of the present disclosure.

FIG. 17 shows a specific example of the brightness adjusting method in the embodiment of the present disclosure, which includes the following steps.

Step 1701, according to practical needs, determining predetermined first color depth, and determining a first quantity of scanning operations of the array substrate within one frame in accordance with the predetermined first color depth.

The data driving chip (Source IC) outputs the data voltage Vi (step 1702), a luminous intensity Li of the array substrate is captured by using an optical test instrument (step 1703), and each set of the data voltage and the corresponding luminous intensity (Vi, Li) is recorded (step 1704). Steps 1702-1704 are performed for multiple times by using different data voltages. A curve relationship, i.e., V-L curve, between the data voltages (V) and the luminous intensities (L) may be obtained and outputted (step 1705).

Next, a correspondence between the data voltages and color depth is determined in accordance with a predetermined correspondence between the brightness values and the color depth, a voltage value table Utable is formed, and the voltage value table Utable is stored in the data driving chip (step 1706).

Step 1707, receiving, by the data driving chip, image data to be displayed and determining color depth of the image data to be displayed.

Step 1708, determining a second quantity of scanning operations of the array substrate within one frame in accordance with the color depth in the case that the color depth is less than or equal to the first color depth.

Step 1709, determining a third quantity of scanning operations of the array substrate within one frame in accordance with the first color depth in the case that the color depth is greater than the first color depth.

Step 1710, determining a first value of the different data voltages in accordance with a difference value between the color depth and the first color depth.

Step 1711, selecting a low-order bit corresponding to the first value from the third color depth, and determining an output data voltage corresponding to the selected low-order bit.

In some embodiments of the present disclosure, the first color depth constitutes a high-order bit of the third color depth and the second color depth constitutes a low-order bit of the third color depth. In the case that the color depth is greater than the first color depth, the first color depth may be selected as a high-order bit, and the quantity of scanning operations of the array substrate within one frame may be determined. Next, a first value of the different data voltages may be determined in accordance with a difference value between the color depth and the first color depth, a low-order bit corresponding to the first value is selected from the third color depth, and an output data voltage corresponding to the selected low-order bit is determined. For example, the third color depth is 4 bits, and the image data to be displayed includes 2 low-order bits, 2 bits may be sequentially selected from the third color depth for display, and the data voltage to be outputted corresponding to the determined 2 bits color depth is determined.

Step 1712, displaying the image data to be displayed in accordance with the output data voltage and/or the first quantity of scanning operations within one frame.

Steps 1707 to 1712 are performed for each of different image data to be displayed, so as to display the different image data to be displayed.

The data driving chip determines a voltage of each active data signal in accordance with a voltage selected from the voltage value table Utable, and outputs the data signal, and the light-emitting element groups are turned on, so as to display the image to be displayed.

According to the method for forming the array substrate in the embodiment of the present disclosure, when the active matrix is used to control the light-emitting element to be turned on or off, it is able to reduce the quantity of control chips. In addition, the cathode and the anode are each arranged in an entire layer manner and at different layers, so it is able to reduce the IR drop of the signal to the greatest extent, reduce the difficulty in wiring, and avoid the increase in the power consumption caused by the line loss.

In another aspect, an array substrate is further provided in the embodiment of the present disclosure, the array substrate is obtainable through the above-mentioned method, and includes: a base substrate, a first electrode layer, a first insulating layer and a second electrode layer arranged sequentially on the base substrate, a light-emitting element group located on the second electrode layer, where the light-emitting element group includes one or more light-emitting elements, each light-emitting element includes a first electrode, a light emitting layer and a second electrode, the first electrode is coupled to the first electrode layer, and the second electrode is coupled to the second electrode layer, so as to drive the light emitting layer to emit light.

In some embodiments of the present disclosure, the array substrate further includes a planarization layer located at a side of the light-emitting element group away from the base substrate; and a driving circuit layer arranged on the planarization layer. The driving circuit layer includes a first switch transistor configured to control the first electrode to be electrically connected to, or electrically disconnected from, the first electrode layer, a first electrode of the first switch transistor is coupled to an auxiliary layer via a first through hole, and a second electrode of the first switch transistor is coupled to the first electrode layer via a second through hole.

In some embodiments of the present disclosure, the driving circuit layer further includes a scanning signal line, a second switch transistor, a data signal line, a storage capacitor and a common electrode layer, a control electrode of the first switch transistor is coupled to a first electrode of the second switch transistor via a through hole, the first electrode of the second switch transistor is coupled to a first electrode plate of the storage capacitor, the data signal line is coupled to a second electrode of the second switch transistor, the scanning signal line is coupled to a control electrode of the second switch transistor, and the common electrode layer is used as a second electrode plate of the storage capacitor.

In specific, the driving circuit layer includes the scanning signal line, the first switch transistor, the second switch transistor, the data signal line, the storage capacitor and the common electrode layer. A source electrode of the first switch transistor is coupled to the first electrode layer via the through hole, a drain electrode of the first switch transistor is coupled to the first electrode of the light-emitting device group, a gate electrode of the first switch transistor is coupled to a source electrode of the second switch transistor via the through hole, a source electrode of the second switch transistor is coupled to the first electrode plate of the storage capacitor, the data signal line is coupled to a drain electrode of the second switch transistor, and the scanning signal line is coupled to a gate electrode of the second switch transistor.

In some embodiments of the present disclosure, the array substrate can further includes a second insulating layer located between the planarization layer and the driving circuit layer. The first through hole penetrates the second insulating layer and a part of the planarization layer, and the second through hole penetrates the second electrode layer.

In some embodiments of the present disclosure, the planarization layer is made of a resin material.

In some embodiments of the present disclosure, each of orthogonal projections of the first electrode layer and the second electrode layer onto the base substrate overlaps projections of all light-emitting elements onto the base substrate.

Figure 18:
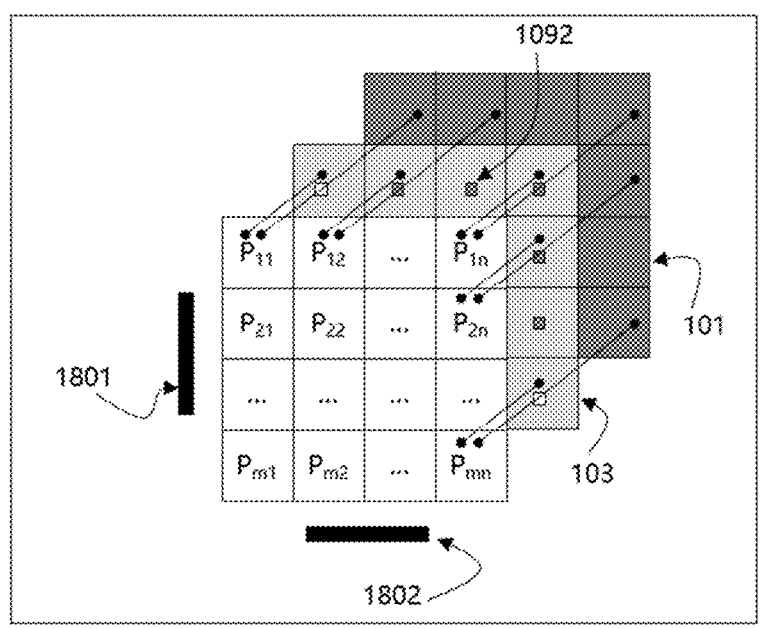
FIG. 18 is another schematic view showing the array substrate according to one embodiment of the present disclosure.

As shown in FIG. 18, the first electrode layer and the second electrode layer are each arranged in an entire layer manner, and each of the orthogonal projections of the first electrode layer and the second electrode layer onto the base substrate overlaps the projections of all light-emitting elements onto the base substrate.

In FIG. 18, 101 denotes the first electrode layer, 103 denotes the second electrode layer, P11, P12, etc. denote pixels, 1092 denotes the second through hole in the second electrode layer 103, 1801 denotes the scanning driving chip (Gate IC), and 1802 denotes the data driving chip (Source IC).

In some embodiments of the present disclosure, the array substrate may further include an auxiliary layer. The auxiliary layer is arranged at a same layer and made of a same material as the second electrode layer and spaced apart from the second electrode layer, the first electrode is arranged at a side of the auxiliary layer away from the base substrate.

The auxiliary layer may be used as a supporting spacer for the first electrode of the light-emitting element group, so it is able to maintain flat when transferring and securing the light-emitting element group, thereby to improve the flatness of the array substrate.

In some embodiments of the present disclosure, as shown in FIGS. 3 and 5-7, orthogonal projections of the first electrode and the second electrode onto the base substrate are at two sides of an orthogonal projection of the light emitting layer onto the base substrate respectively.

In the embodiments of the present disclosure, the light-emitting element group may be a single light-emitting element or a plurality of light-emitting elements. In the case that the light-emitting element group includes the plurality of light-emitting elements, the plurality of light-emitting elements is arranged in parallel or in series. When the plurality of light-emitting elements is arranged in parallel or in series, it is able to control the plurality of light-emitting elements to be turned on or off by using a single control switch. The light-emitting element may be a light emitting diode, and the light emitting diode may be a LED, a mini-LED or a Micro-LED.

In the embodiments of the present disclosure, the planarization layer may be made of an insulation resin material. When the insulation resin having a light-scattering function, rather than the protection adhesive of the light-emitting element (group) in the related art, is used, it is able to soften the light, improve the process accuracy and reduce the process steps. According to requirement on softening the light of the light-emitting element group, components of the resin material may be adjusted. For example, various components having different refractive indices are added, so as to achieve the light-scattering effect. Various color filter materials may also be added, to adjust the overall chromaticity of the product. A certain amount of fluorescent agent may even be added, to achieve that a same light-emitting element (group) emits light in different colors.

According to array substrate in the embodiment of the present disclosure, when the active matrix is used to control the light-emitting element to be turned on or off, it is able to reduce the quantity of control chips. In addition, the cathode and the anode are each arranged in an entire layer manner and at different layers, so it is able to reduce the IR drop of the signal to the greatest extent, reduce the difficulty in wiring, and avoid the increase in the power consumption caused by the line loss.

In yet another aspect, a display panel is further provided in the present disclosure, including the above-mentioned array substrate. According to the display panel in the embodiment of the present disclosure, when the active matrix is used to control the light-emitting element to be turned on or off, it is able to reduce the quantity of control chips. In addition, the cathode and the anode are each arranged in an entire layer manner and at different layers, so it is able to reduce the IR drop of the signal to the greatest extent, reduce the difficulty in wiring, and avoid the increase in the power consumption caused by the line loss.

In still yet another aspect, a display device is further provided, including the above-mentioned display panel. According to the display device in the embodiment of the present disclosure, when the active matrix is used to control the light-emitting element to be turned on or off, it is able to reduce the quantity of control chips. In addition, the cathode and the anode are each arranged in an entire layer manner and at different layers, so it is able to reduce the IR drop of the signal to the greatest extent, reduce the difficulty in wiring, and avoid the increase in the power consumption caused by the line loss.

The above embodiments are optional embodiments of the present disclosure, it should be appreciated, those skilled in the art may make various improvements and modifications without departing from the principle of the present disclosure, and theses improvement and modifications shall fall within the protection scope of the present disclosure.

What is claimed is:

1. An array substrate, comprising:
   a base substrate;
   a first electrode layer, a first insulating layer, and a second electrode layer arranged sequentially on the base substrate,
   a light-emitting element group located on the second electrode layer, wherein the light-emitting element group comprises one or more light-emitting elements, each light-emitting element comprises a first electrode, a light emitting layer, and a second electrode, wherein the first electrode is coupled to the first electrode layer, and the second electrode is coupled to the second electrode layer, so as to drive the light emitting layer to emit light;

wherein the array substrate further comprises a planarization layer located at a side of the light-emitting element group away from the base substrate; and a driving circuit layer arranged on the planarization layer, wherein the driving circuit layer comprises a first switch transistor configured to control the first electrode to be electrically connected to, or electrically disconnected from, the first electrode layer, a first electrode of the first switch transistor is coupled to a first electrode of the light-emitting element group via a first through hole, and a second electrode of the first switch transistor is coupled to the first electrode layer via a second through hole;

wherein the array substrate further comprises a second insulating layer located on the planarization layer, wherein the first through hole penetrates the second insulating layer and a part of the planarization layer, and the second through hole penetrates the second electrode layer.

2. The array substrate according to claim 1, wherein the driving circuit layer further comprises a scanning signal line, a second switch transistor, a data signal line, a storage capacitor and a common electrode layer, wherein a control electrode of the first switch transistor is coupled to a first electrode plate of the storage capacitor via a through hole penetrating the second insulating layer, a first electrode of the second switch transistor is coupled to the first electrode plate of the storage capacitor, the data signal line is coupled to a second electrode of the second switch transistor, the scanning signal line is coupled to a control electrode of the second switch transistor, and the common electrode layer is used as a second electrode plate of the storage capacitor.

3. The array substrate according to claim 1, wherein the first electrode layer and the second electrode layer are each arranged in an entire layer manner.

4. The array substrate according to claim 1, further comprising an auxiliary layer, wherein the auxiliary layer is arranged at a same layer and made of a same material as the second electrode layer and spaced apart from the second electrode layer, the first electrode is arranged at a side of the auxiliary layer away from the base substrate.

5. The array substrate according to claim 1, wherein orthogonal projections of the first electrode and the second electrode onto the base substrate are at two opposing sides of an orthogonal projection of the light emitting layer onto the base substrate.

6. The array substrate according to claim 1, wherein, in the case that the light-emitting element group comprises a plurality of light-emitting elements, the plurality of light-emitting elements is arranged in parallel or in series.

7. A display panel, comprising the array substrate according to claim 1.

8. A brightness adjusting method for the array substrate according to claim 2, comprising:
determining a first quantity of scanning operations of the array substrate within one frame in accordance with a first color depth, wherein pixels in each row of the array substrate are scanned during each scanning process.

9. The brightness adjusting method according to claim 8, further comprising:
applying a scanning signal to the control electrode of each second switch transistor in the array substrate, to turn on each second switch transistor;
applying different data voltages to the second electrode of each second switch transistor;
determining brightness values of light-emitting element groups in the array substrate corresponding to the different data voltages, and establishing a correspondence between the data voltages and the brightness values; wherein the quantity of different data voltages is determined in accordance with a second color depth, and the first color depth and the second color depth constitute third color depth; and
determining a correspondence between the data voltages and color depth in accordance with a correspondence between the brightness values and the color depth.

10. The brightness adjusting method according to claim 9, wherein the determining the brightness values of the light-emitting element groups in the array substrate corresponding to different data voltages comprises:
determining the brightness values of the light-emitting element groups corresponding to different data voltages in accordance with a correspondence between the brightness values of the light-emitting element groups and currents of the light-emitting element groups and a correspondence between the currents of the light-emitting element groups and voltages of the light-emitting element groups.

11. The brightness adjusting method according to claim 9, wherein the first color depth constitutes a high-order bit of the third color depth and the second color depth constitutes a low-order bit of the third color depth.

12. The brightness adjusting method according to claim 11, further comprising:
receiving image data to be displayed;
determining color depth of the image data to be displayed;
determining a second quantity of scanning operations of the array substrate within one frame in accordance with the color depth in the case that the color depth is less than or equal to the first color depth;
determining a third quantity of scanning operations of the array substrate within one frame in accordance with the first color depth in the case that the color depth is greater than the first color depth;
determining a first value of the different data voltages in accordance with a difference value between the color depth and the first color depth;
selecting a low-order bit corresponding to the first value from the third color depth, and determining an output data voltage corresponding to the selected low-order bit; and
displaying the image data to be displayed in accordance with the output data voltage and/or the first quantity of scanning operations within one frame.

13. The brightness adjusting method according to claim 8, wherein the array substrate further comprises an enable signal Input end, and when the pixels in each row of the array substrate are scanned, the method further comprises:
applying an enable signal to the enable signal Input end;
applying an active scanning signal to the control electrode of each second switch transistor in each row at a first rising edge of the enable signal, to turn on each second switch transistor;
applying an active data voltage to the second electrode of each second switch transistor in each row at a second rising edge of the enable signal;
applying an inactive scanning signal to the control electrode of each second switch transistor in each row at a first falling edge of the enable signal; and
applying an inactive data voltage to the second electrode of each second switch transistor in each row at a second falling edge of the enable signal.

14. A method for forming a display substrate, comprising:
forming a first electrode layer, a first insulating layer, and a second electrode layer on a base substrate sequentially; and
forming a light-emitting element group at a side of the second electrode layer away from the base substrate, wherein the light-emitting element group comprises one or more light-emitting elements, each light-emitting element comprises a first electrode, a light emitting layer, and a second electrode, wherein the first electrode is coupled to the first electrode layer, and the second electrode is coupled to the second electrode layer, so as to drive the light emitting layer to emit light;
wherein the method further comprises:
forming a planarization layer at a side of the light-emitting element group away from the base substrate; and
forming a driving circuit layer at a side of the planarization layer away from the base substrate, wherein the driving circuit layer comprises a first switch transistor configured to control the first electrode to be electrically connected to, or electrically disconnected from, the first electrode layer, a first electrode of the first switch transistor is coupled to a first electrode of the light-emitting element group via a first through hole, and a second electrode of the first switch transistor is coupled to the first electrode layer via a second through hole;
wherein the first through hole penetrates a second insulating layer and a part of the planarization layer, and the second through hole penetrates the second electrode layer.

15. The method according to claim 14, wherein the driving circuit layer further comprises a scanning signal line, a second switch transistor and a storage capacitor,
subsequent to forming the planarization layer at the side of the light-emitting element group away from the base substrate, the method further comprises:
forming the scanning signal line, a control electrode of the first switch transistor and a control electrode of the second switch transistor at the side of the planarization layer away from the base substrate;
forming the second insulating layer;
forming a semiconductor layer at a side of the second insulating layer away from the base substrate;
forming a data signal line, the first electrode and the second electrode of the first switch transistor, a first electrode and a second electrode of the second switch transistor, and a first electrode plate of the storage capacitor at a side of the semiconductor layer away from the base substrate; wherein the control electrode of the first switch transistor is coupled to the first electrode plate of the storage capacitor via a through hole penetrating the second insulating layer, the first electrode of the second switch transistor is coupled to the first electrode plate of the storage capacitor, the data signal line is coupled to the second electrode of the second switch transistor, and the scanning signal line is coupled to the control electrode of the second switch transistor; and
forming a third insulating layer and a common electrode layer, wherein the common electrode layer forms a second electrode plate of the storage capacitor, an orthogonal projection of the common electrode layer onto the base substrate at least partially overlaps an orthogonal projection of the first electrode plate of the storage capacitor onto the base substrate.

16. The method according to claim 14, wherein the forming the second electrode layer comprises:
forming the second electrode layer and an auxiliary layer simultaneously by using a same mask through a same patterning process, wherein the auxiliary layer is spaced apart from the second electrode layer, and the first electrode is arranged at a side of the auxiliary layer away from the base substrate.

17. The method according to claim 14, wherein the planarization layer is made of a resin material.